United States Patent [19]

Tanaka et al.

[11] Patent Number: 4,517,528

[45] Date of Patent: May 14, 1985

[54] AMPLIFIER CIRCUIT DRIVEN BY GROUND ISOLATED POWER SUPPLY

[75] Inventors: Susumu Tanaka; Ryosuke Ito, both of Tokyo, Japan

[73] Assignee: Sansui Electric Co., Ltd., Tokyo, Japan

[21] Appl. No.: 436,892

[22] Filed: Oct. 26, 1982

[30] Foreign Application Priority Data

Oct. 31, 1981 [JP] Japan .................. 56-162837[U]
Oct. 31, 1981 [JP] Japan .................. 56-162833[U]
Aug. 9, 1982 [JP] Japan .................. 57-119871[U]

[51] Int. Cl.³ ................... H03F 3/04; H03F 3/20
[52] U.S. Cl. ..................... 330/297; 330/263; 330/200
[58] Field of Search ............. 330/262, 263, 267, 297, 330/199, 200, 202, 252, 255, 261

[56] References Cited

U.S. PATENT DOCUMENTS 4,206,419  6/1980  Yokoyama ............... 330/297
4,321,428  3/1982  Seki ....................... 330/252

OTHER PUBLICATIONS

J. B. Dance, "Principles of Power Amplifier Design High Quality Circuits Using Power Darlingtons" Australian Electronics Engineering, Dec. 1976, vol. 9, No. 12.

*Primary Examiner*—James B. Mullins
*Assistant Examiner*—G. Wan
*Attorney, Agent, or Firm*—Sughrue, Mion, Zinn, Macpeak and Seas

[57] ABSTRACT

Disclosed is an amplifier wherein, in order to prevent the mixing of hum and other noise from the ground potential of the amplifier, the driving power supply circuit of the amplifier is separated from the ground potential into a floating state. In addition, the overall capacity of the power supply is reduced.

10 Claims, 13 Drawing Figures

PRIOR ART

AMPLIFIER CIRCUIT DRIVEN BY GROUND ISOLATED POWER SUPPLY

BACKGROUND OF THE INVENTION

1. Field of the Invention

The present invention relates to amplifiers, and more particularly to an amplifier which has its driving power supply circuit separated from the ground potential thereof.

2. Description of the Prior Art

In amplifiers for audio use, especially power amplifiers for output, various output types have been proposed.

FIG. 1 of the accompanying drawings is a circuit diagram showing an example of a BTL (balanced transformerless) amplifier.

The BTL amplifier is such that two sets of, e.g., SEPP (single-ended push-pull) amplifiers are operated in phase opposition to each other, and that a load is connected between the output points of the respective SEPP amplifers. This type is known as a system which enhances the voltage utilization factors of the SEPP amplifiers etc. still more.

In the arrangement of FIG. 1, a signal applied to an input terminal 1 is supplied to pre-amplifiers 2 and 3. The pre-amplifiers 2 and 3 are respectively constructed as a noninverting amplifier and an inverting amplifier. Outputs from the pre-amplifier 2 and 3 are respectively applied to SEPP output circuits 4 and 5 so as to drive a load, such as loudspeaker 8, which is connected between the respective output terminals 6 and 7 of the SEPP output circuits 4 and 5. On the other hand, a power transformer 9 (only a secondary coil is shown) which properly steps down an input voltage from a commercial power supply has its secondary side output rectified by a rectifier circuit 10 which is constructed of, e.g., a diode bridge. The center tap 9A of the power transformer 9 is connected to a reference potential $E_1$. Smoothing capacitors 11 and 12 are respectively interposed between the center tap 9A and the outputs of the rectifier circuit 10 with positive and negative signs, to smooth both the positive and negative outputs of the rectifier circuit 10. Positive and negative D.C. voltages $+B$ and $-B$ thus produced are supplied to the output circuits 4 and 5 as supply voltages.

The respective pre-amplifiers 2 and 3 are provided with feedback circuits 2A and 3A so as to apply negative feedback.

The parts of the SEPP output circuits 4, 5 and the smoothing capacitors 11, 12 of the power supply in such circuit arrangement are extracted as shown in FIG. 2. In this figure, signal currents Y and Z flow through the transistors $Tr_1$-$Tr_4$ of the SEPP output circuits 4, 5 and the load 8 as illustrated by arrows. That is, the smoothing capacitors 11, 12 of the voltage supply source are connected in series with the load 8. Here, letting C denote the capacitance of each of the smoothing capacitors 11 and 12, and R denote the resistance of the load 8, the time constant T between the power supply circuit and the load is given by the following equation:

$$T = \tfrac{1}{2} R C \qquad (1)$$

Since the supply voltages are $+B$ and $-B$, the rated voltages of the respective smoothing capacitors 11 and 12 need to be the voltage B. Accordingly, the overall capacity $P_1$ of this power supply circuit, which is given by the product among the capacitance and rated voltage of each capacitor and the number of the capacitors, is expressed by the following equation:

$$P_1 = C \times B \times 2 = 2 C B \qquad (2)$$

In such arrangement, the two smoothing capacitors 11 and 12 are required for the positive and negative signs, and these capacitors are connected in series with the load 8. Regarding the time constant of the power supply circuit, therefore, the combined capacitance of the smoothing capacitors 11 and 12 becomes $\tfrac{1}{2}$ as a whole. It turns out that smoothing capacitors of large capacitance are required for increasing the time constant of the power supply circuit. Moreover, the reference potential $E_1$ for the great currents, which flow from the positive and negative supply voltage sources $+B$ and $-B$ to the load 8, a reference potential $E_2$ for the input signal to be amplified, and reference potentials $E_3$ and $E_4$ for the respective pre-amplifiers 2 and 3 to amplify the input signal, are an identical potential (the points of the reference potentials are directly connected to one another). Therefore, the signal to be amplified flows, not only to the point of the reference potential $E_2$, but also to the points of the reference potentials $E_3$ and $E_4$ of the respective pre-amplifiers 2 and 3. The hum etc. of the power supply accordingly have evil effects on the pre-amplifiers 2, 3 due to the great currents flowing through a point of the reference potential $E_1$, and form causes for the degradation of the tone quality of an audio equipment provided with the amplifier.

Another prior-art power amplifier has an output arrangement as shown in FIG. 3. Referring to the figure, a differential amplifier circuit 13 is constructed of a pair of transistors $Tr_5$ and $Tr_6$, the base of one of which is supplied with an audio signal through an input terminal 1. The resulting output is applied to the base of a transistor $Tr_7$ which constitutes an output power amplifier 14, and an amplified signal provided from the collector of this transistor $Tr_7$ is applied to a loudspeaker, not shown, through an output terminal 16.

Numeral 17 indicates a current source. The differential amplifier circuit 13 and the output power amplifier 14 are supplied with positive and negative D.C. voltages $+B$ and $-B$. These supply voltages are similar to those illustrated in FIG. 1, and are obtained in such a way that the secondary side output of a power transformer 9 is rectified by a diode bridge 10, whereupon the rectified outputs are smoothed by smoothing capacitors 11 and 12.

In such arrangement, the input and output operations of the audio signal are carried out by the unbalanced circuit, one line of which is held at the ground potential and connected to a chassis, a case or the like, along with one line of the power supply circuit. Accordingly, one input terminal is connected to a reference (ground) potential $E_2$, one output terminal 16 is connected to a reference (ground) potential $E_6$, one end of the differential amplifier circuit is connected to a reference (ground) potential $E_5$, and the center tap 9A of the power transformer 9 and one terminal of each of the capacitors 11 and 12 are connected to a reference (ground) potential $E_1$.

Such arrangement, however, has the disadvantage that when another equipment, e. g., a pre-amplifier is connected to the input terminal 1, a minute potential difference involved between the ground potentials of the amplifier and the equipment and also hum and other noise affect the ground potential of the amplifier, and they flow into the circuit of the audio signal, resulting in the degradation of the quality of the amplified signal. Another problem is that, since great currents flow from the power supply to the point of the ground potential $E_1$, the hum component etc. of the power supply causes evil effects through the ground potential point $E_1$ of the input terminal 1 and those $E_5$ and $E_6$ of the respective amplifier circuits 13 and 14.

A BTL amplifier having a single supply voltage as shown in FIG. 4 is also known which is so constructed as to avoid the overall capacity $P_1$ of the power supply indicated by Equation (2), this capacity forming one disadvantage of the prior art as explained before. In this case, two rectifier diodes 10a and one smoothing capacitor 11a suffice. Since, however, the reference potential point $E_1$ of the power supply and those $E_2$, $E_3$ and $E_4$ of an input signal to be amplified are equipotential, inevitably the current of the power supply affects the signal adversely and degrades the tone quality of an audio equipment provided with the amplifier. Moreover, in such amplifier, a voltage substantially equal to $\frac{1}{2}$ of the supply voltage B is applied between an output terminal 6 or 7 and the reference potential even during the absence of any signal. Therefore, it is dangerous to touch the output end and a chassis held at the reference potential.

SUMMARY OF THE INVENTION

The present invention has been made in view of the disadvantages mentioned above, and has for its object to provide an amplifier wherein an input amplifier circuit and an output amplifier circuit are constructed separated from a ground potential, and also a power supply circuit is separated from the ground potential, so as to eliminate the influences of hum and other noise arriving through a grounded circuit, whereby an audio signal can be amplified at high quality.

Another object of the present invention is to provide an amplifier which can employ a smoothing capacitor for a power supply circuit affording a small overall capacity of power supply.

Still another object of the present invention is to provide an amplifier which is not dangerous even when a chassis etc. are touched by hand.

Yet another object of the present invention is to provide an amplifier which is adapted to supply a BTL amplifier with a voltage output obtained by separating a driving supply voltage of a power supply circuit from a ground potential.

A further object of the present invention is to provide an amplifier which is adapted to supply a current amplification type pre-amplifier or output amplifier with a voltage output obtained by separating a driving supply voltage of a power supply circuit from a ground potential.

The aforementioned and other objects of the present invention will become more apparent from the following detailed description taken with reference to the drawings.

PREFERRED EMBODIMENTS OF THE INVENTION

Figure 5:
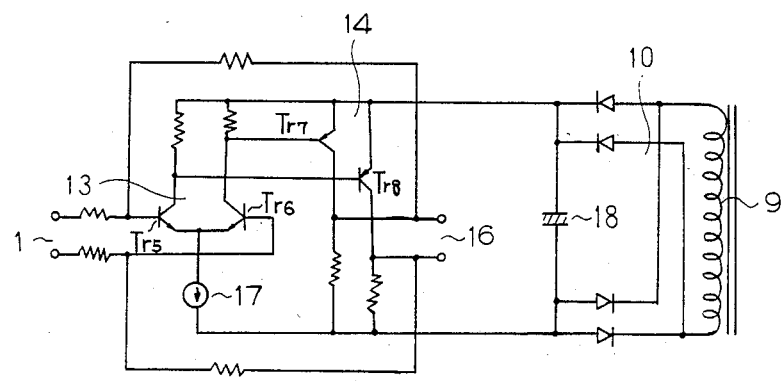
FIG. 5 is a circuit diagram of an amplifier showing the principle arrangement of the present invention.

An embodiment of the present invention will now be described in detail with reference to a circuit diagram shown in FIG. 5. Numeral 1 designates input terminals, across which an audio signal is applied. The input signal is applied to the bases of a pair of transistors $Tr_5$ and $Tr_6$ which constitute a differential amplifier circuit. Thus, the differential amplifier circuit constitutes a balanced input circuit. Output signals from the differential amplifier circuit 13 are applied to the bases of a pair of transistors $Tr_7$ and $Tr_8$ which constitute an output amplifier circuit 14. The collectors of the transistors of the output amplifier circuit 14 are respectively connected to output terminals 16. Thus, a balanced output circuit is constructed. The output of the secondary winding of a power transformer 9 for stepping down a commercial power supply is subjected to full-wave rectification by a rectifier circuit 10 which consists of diodes in a bridge connection. The rectified output is smoothed by a single smoothing capacitor 18, and the smoothed output is applied to the differential amplifier circuit 13 and the output amplifier circuit 14 so as to drive them.

With such arrangement, all the circuits can be separated from the ground potential of a chassis, a case or the like, whereby hum and other noise do not mix in from the ground potential, and current flowing through the part of the ground potential does not have any evil effect, either. Further, in case of connecting another electronic device to the amplifier, no influence is exerted on the audio signal even when the ground potentials of the device and the amplifier are connected in common. In this case, the audio signal must be delivered from the electronic device by means of a balanced output circuit.

Figure 6:
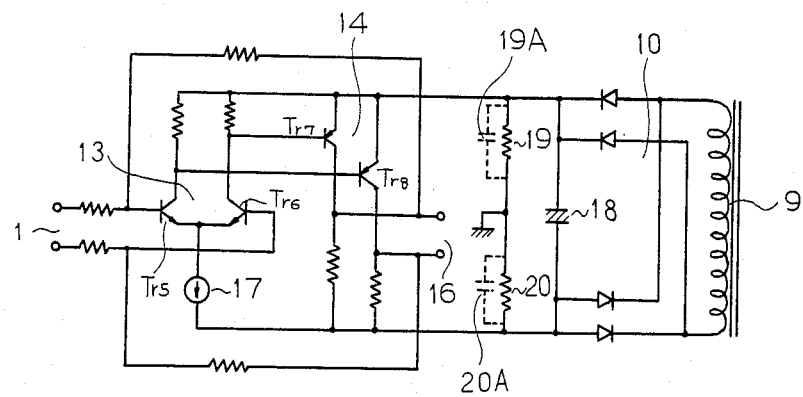
FIG. 6 is a circuit diagram of an amplifier showing another principle arrangement of the present invention.

As shown in FIG. 6, positive and negative outputs may be connected to the ground potential through resistors 19 and 20 having high resistances on the order of 10 $k\Omega$, in order to determine potentials with respect to the ground potential of the circuit. Further, as indicated by dotted lines in FIG. 6, capacitors 19a and 20a having capacitances equal to 1/10–1/100 of that of the smoothing capacitor 18 may be connected in parallel with the high resistances. In this case, it is a matter of course that the resistors 19 and 20 should have the impedances sufficient to hinder hum and other noise from affecting the audio signal.

Figure 7:
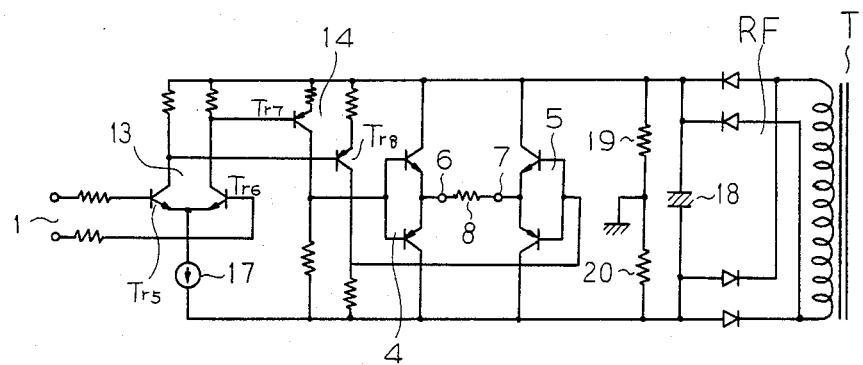
FIG. 7 is a circuit diagram of an amplifier showing a modified embodiment of the arrangement in FIG. 6.

FIG. 7 shows a case where final output amplifiers 4 and 5 are added to the output stage of the amplifier 14 in the arrangement of FIG. 6.

Figure 1:
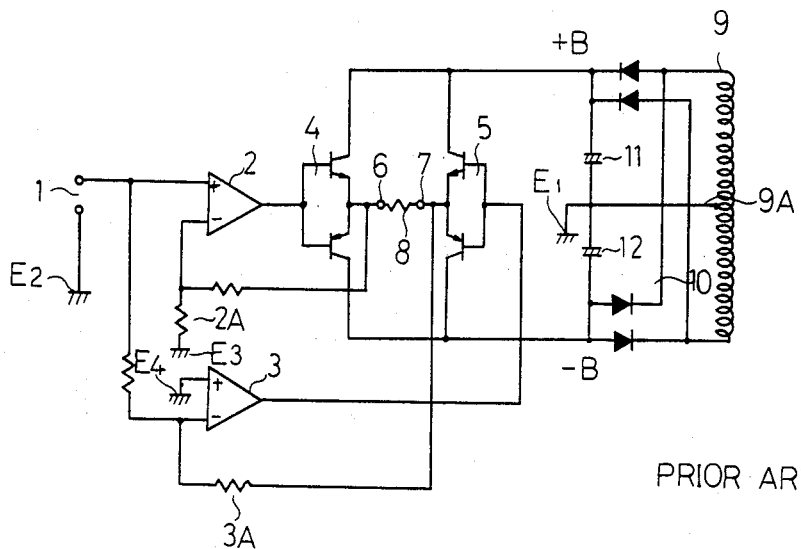
FIG. 1 is a circuit diagram showing an example of a prior-art BTL amplifier.
Figure 8:
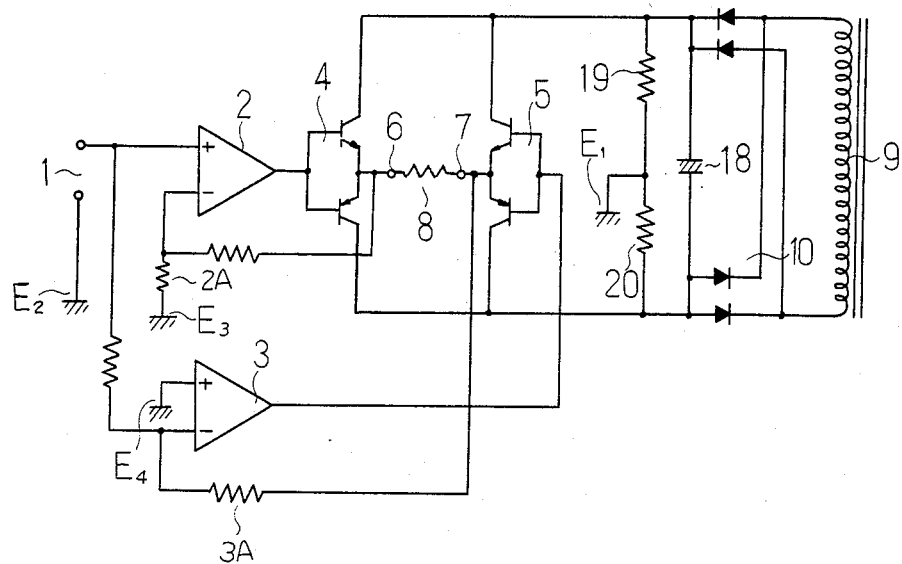
FIG. 8 is a circuit diagram in the case where the present invention is applied to a BTL amplifier.

FIG. 8 shows an embodiment in which the present invention is applied to a BTL amplifier. The same parts as in FIG. 1 are assigned the same symbols, and will not be repeatedly explained. The arrangement of the power supply circuit is the same as in FIG. 6 or FIG. 7.

In this embodiment, the smoothing capacitor 18 is interposed between the outputs of the diode bridge 10 having the positive and negative signs. Further, both the ends of the smoothing capacitor 18 are connected to the reference potential through the resistors 19 and 20 of high resistances, e.g., 10 kΩ.

With such arrangement, the signal applied to the input terminal 1 is amplified by the noninverting amplifier 2 as well as the inverting amplifier 3 and then applied to the SEPP output circuits 4 and 5, the amplified outputs of which are provided at the output terminals 6 and 7.

Figure 2:
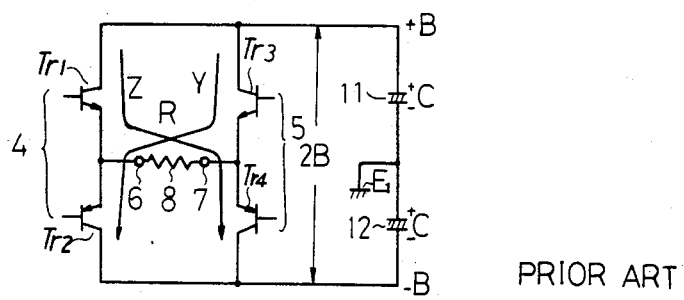
FIG. 2 is a circuit diagram in which the parts of output amplifiers and smoothing capacitors in FIG. 1 are extracted in order to explain the flow of currents.
Figure 3:
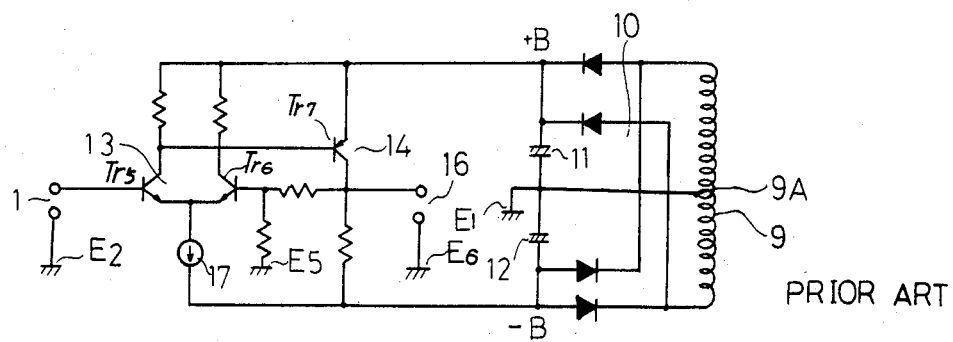
FIG. 3 is a circuit diagram of a prior-art unbalanced amplifier.
Figure 4:
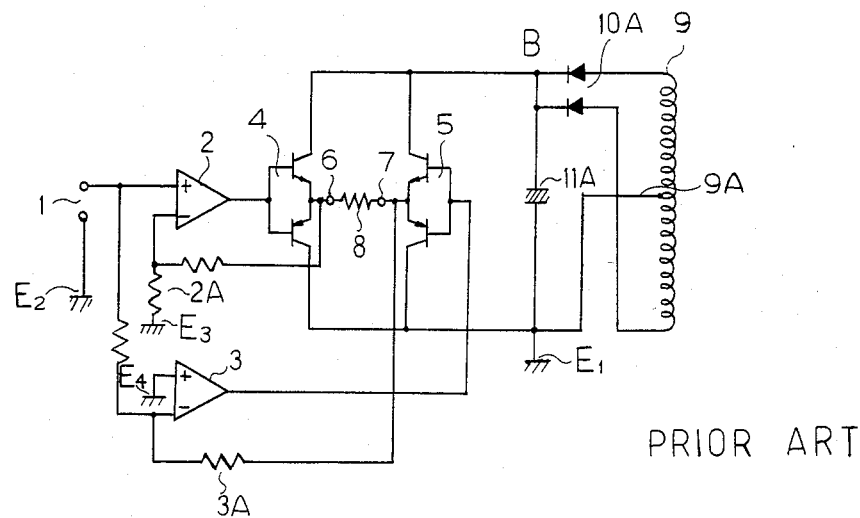
FIG. 4 is a circuit diagram showing another prior-art BTL amplifier.
Figure 9:
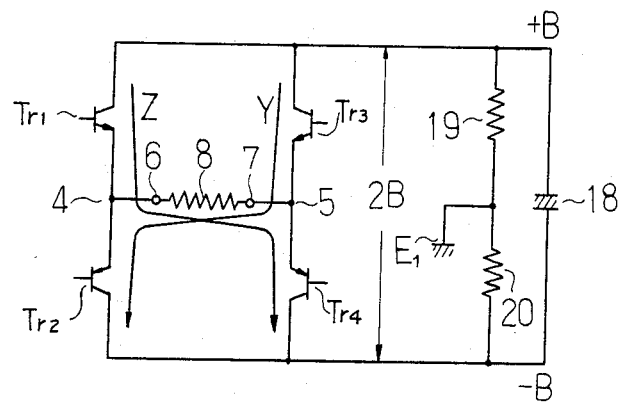
FIG. 9 is a circuit diagram in which the parts of output amplifiers and smoothing capacitors in FIG. 8 are extracted in order to explain the operation of the embodiment in FIG. 8.

Here, the parts of the SEPP circuits 4, 5 and the smoothing capacitor 18 of the power supply are as shown in FIG. 9. In such circuit, the signal currents flow through the transistors $Tr_1$–$Tr_4$ of the SEPP output circuits 4, 5 and the load 8 as indicated by letters Y and Z. More specifically, when a time constant for the load 8 is equalized to that in the prior art illustrated in FIG. 2, the capacitance of the smoothing capacitor 18 may be a half, and the withstand voltage thereof may be made 2·B. The overall capacity P of the power supply in this case is given by the following equation (3):

$$P = C/2 \times 2B = C\,B \tag{3}$$

Thus, the overall capacity P of the power supply can be halved as apparent from Equation (3). The arrangement can be simplified and the cost can be lowered, owing to the facts that the single smoothing capacitor 18 suffices and that the center tap 9A is unnecessary on the secondary side of the power transformer 9. Further, since the positive and negative outputs +B and −B of the diode bridge 10 are connected to the reference potential through the high resistances 19 and 20, great currents from the power supply do not flow to the reference potential, and the noninverting amplifier 2, the inverting amplifier 3, etc. are not adversely affected by the great currents, either. Besides, since the output terminals 6 and 7 are held at the reference potential during the absence of the signal, quite no problem occurs as to safety.

In the embodiments of the present invention, the high resistances 19 and 20 which are interposed between the positive and negative outputs of the diode bridge 10 and the reference potential need not have equal values. That is, suitable values may be used in the range in which the amplifiers 2, 3 and the corresponding SEPP output circuits 4, 5 can be matched. Further, the impedance of the power supply to the reference potential in a higher frequency region may be especially lowered in such a way that capacitors having capacitances equal to 1/10–1/100 of the capacitance of the smoothing capacitor 18 are connected in parallel with the high resistance 19 and 20.

Figure 10:
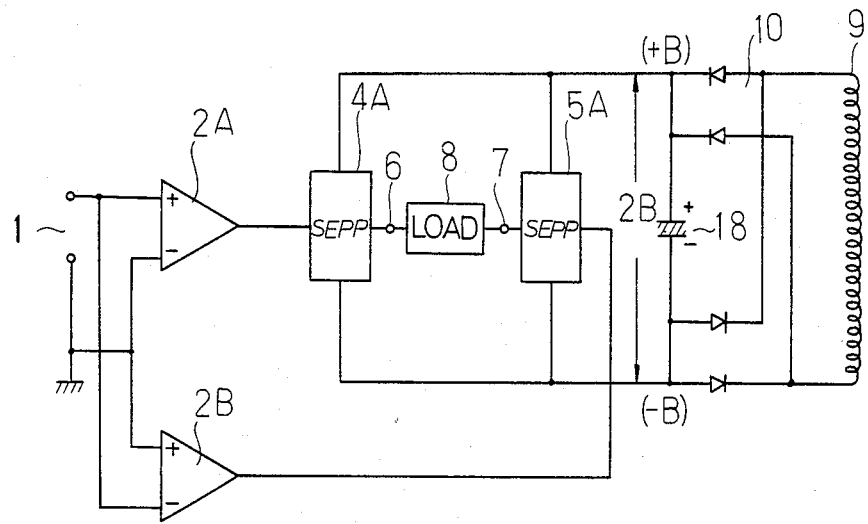
FIG. 10 is a model circuit diagram showing the schematic arrangement of an amplifier according to another embodiment of the present invention.

FIG. 10 shows still another embodiment of the present invention. Input terminals 1, output terminals 6 and 7, a load 8, a power transformer 9 (only the secondary coil thereof is shown), and a rectifier circuit 10 constructed of, e. g., a diode bridge are substantially similar to those in the case of FIG. 1. Symbols 2a and 2b denote pre-amplifiers which amplify an input signal as a noninverting amplifier and an inverting amplifier, respectively. In this case, these pre-amplifiers 2a and 2b are constructed of amplifiers of the current output type which provides a current signal corresponding to the input voltage signal. Numeral 18 designates a smoothing capacitor which is inserted between the positive and negative output ends of the rectifier circuit 10. A floating D.C. supply voltage 2·B appears across both the ends of the smoothing capacitor 18. Shown at 4a and 5a are SEPP output circuits which are respectively driven by the pre-amplifiers 2a and 2b. These SEPP output circuits 4a and 5a are constructed as current amplifiers which are fed with the supply voltages from both the ends of the smoothing capacitor 18 and which amplify the current outputs of the pre-ampifiers 2a and 2b and provide current signals.

In the arrangement of FIG. 10, the secondary side output of the power transformer 9 is rectified in full wave by the rectifier circuit of the diode bridge 10, and the D.C. voltage develops across the smoothing capacitor 18. The D.C. power supply is a floating power supply (substantially separated from a reference potential common to the other parts) having the supply voltage 2·B. The input signal applied to the input terminals 1 is a voltage signal in this case, and current signals corresponding to the input signal are delivered from the pre-amplifiers 2a and 2b of the current output type, in phase opposition to each other. The current signals are respectively subjected to current amplification by the SEPP output circuits 4a and 5a which are constructed as current amplifiers that receive the D.C. supply voltage from both ends of the smoothing capacitor 18. Thus, output currents are fed to the load 8 through the output terminals 6 and 7.

As described above, the pre-amplifiers 2a and 2b are current output type amplifiers, and the SEPP output circuits 4a and 5a are current input - current output type amplifiers. Therefore, even when the positive and negative supply voltages fed to the SEPP output circuits 4a and 5a are not equal, these SEPP output circuits amplify the applied current signals and feed the amplified current signals to the load 8. The circuitry operates normally even when the power supply for the SEPP output circuits 4a and 5a floats with respect to ground.

In this regard, with the prior-art arrangement shown in FIG. 1, substantially equalizing the positive and negative voltages to the applied to the SEPP output circuits 4 and 5 is required for equalizing the positive and negative clip voltages of the signal, etc. so as to enhance the utilization factor of the power supply. In spite of the various drawbacks described before, accordingly, the reference potential of the power supply circuit and those of the signal system are directly connected to establish the identical potential.

In contrast, with the foregoing arrangement of FIG. 10, even when the power supply for the SEPP output circuits 4a and 5a floats, the positive and negative clip voltages of the output signal, etc. are equal, and the utilization factor of the power supply can be made high.

Figure 11:
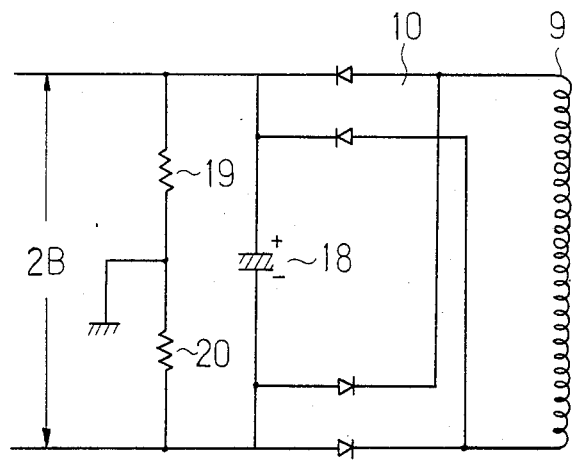
FIG. 11 is a circuit diagram showing the arrangement of essential portions in another embodiment of the present invention.

FIG. 11 shows an arrangement wherein, similarly to the arrangement shown in FIG. 9, the power supply of the SEPP output circuits 4a and 5a is not perfectly floating, the series circuit which consists of the resistors 19 and 20 having equal high resistances is interposed between the positive and negative supply voltage output ends, and the node of the high resistances 19 and 20, namely, the middle point of the positive and negative voltages is connected to the reference potential point. The resistors 19 and 20 should desirably have large resistance values on the order of 10 kΩ as explained before. When the values are small, power losses develop in these resistors.

Figure 12:
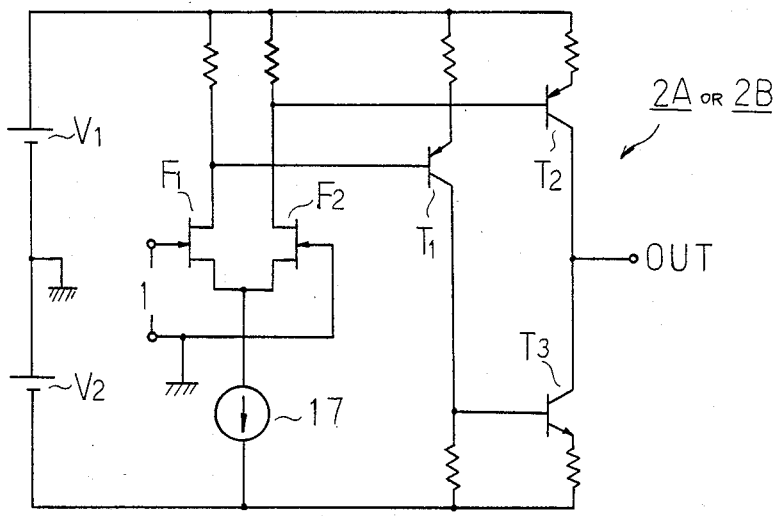
FIGS. 12 and 13 are circuit diagrams each showing an example of the concrete arrangement of essential portions for use in the embodiment of the present invention.

The concrete form of the current output type preamplifier 2a or 2b may be, for example, an amplifier circuit based on the so-called open collector circuit as illustrated in FIG. 12.

Referring to FIG. 12, numeral 1 denotes input terminals, symbols $F_1$ and $F_2$ FETs (field-effect transistors), symbols $T_1$, $T_2$ and $T_3$ transistors, numeral 17 a current source, symbol OUT an output terminal, and symbols $V_1$ and $V_2$ D.C. power sources.

Figure 13:
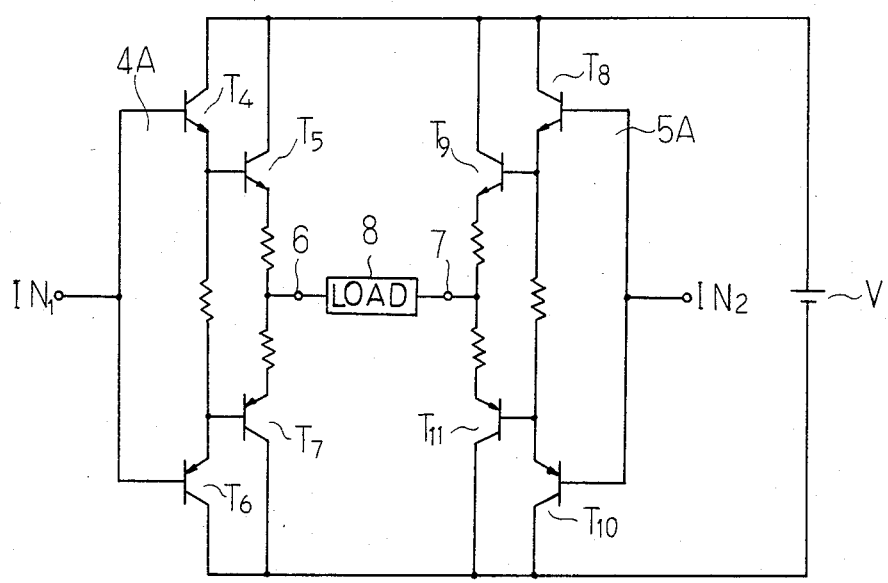

On the other hand, the concrete form of the SEPP output circuits 4a and 5a constructed of current amplifiers may be, for example, Darlington emitter follower circuits as shown in FIG. 13.

Referring to FIG. 13, symbols $IN_1$ and $IN_2$ denote input terminals, symbols $T_4$–$T_{11}$ transistors, and symbol V a D.C. power source.

It is of course allowed that the ohase inversion is not performed by the pre-amplifier 2b, but that a phase inversion output is obtained in the preceding stage thereof in advance.

The embodiments thus far described bring forth the following effects:

(A) Only one smoothing capacitor 18 suffices as the capacitor of a power supply, so that the amplifier can be constructed simply and inexpensively.

(B) The power transformer 9 does not require a center tap, so that the amplifier can be constructed simply and inexpensively.

(C) In a case where a time constant for the load 8 is equal to that in the prior art, the capacitance of the smoothing capacitor 18 may be C/2 where C denotes the capacitance of each smoothing capacitor 11 or 12 in FIG. 1, and the withstand voltage thereof needs to be 2·B where B denotes the magnitude of a supply voltage. Accordingly, the overall capacity $P_1$ of the power supply becomes:

$$P_1 = C/2 \times 2 B = C B$$

This capacity is about half of the capacity in the prior art, so that the power supply of the amplifier can be constructed inexpensively.

(D) The reference potential point (earth) of the preamplifiers 2a, 2b and the power supply circuit of the SEPP output circuits 4a, 5a through which great currents flow, are separated and are not connected at all. Therefore, the input signal pre-amplifiers 2a, 2b, etc. are not affected by the circuits of the great currents.

(E) Since no voltage develops between the BTL output terminals 6, 7 and the reference potential points of the chassis etc. (the reference potential points of the pre-amplifiers 2a, 2b etc. during the absence of the output signal, there is no danger of electric shock. Moreover, even when one of the output terminals 6 and 7 is connected to the reference potential point in the presence of the output signal, a great current does not flow therebetween, so that the amplifier is safe and is not feared to break down.

After all, the important feature of the present invention consists in that an amplifier which has a balanced input circuit and a balanced output circuit is driven by supplying it with electric power from a power supply separated from a ground potential. Accordingly, the invention can provide amplifiers for audio use etc. which can eliminate the mixing of hum and other noise from the ground potential or bad influences attributed to the currents of a power supply flowing through the points of the ground potential, thereby to amplify audio signals etc. at high quality.

What is claimed is:

1. An amplifier comprising input means for preamplifying an input signal, output means for power-amplifying at least one output from said input means and haing a two terminal, balanced output circuit, a load connected between said two terminals, and power supply means for feeding electric power for driving said input means and said output means, said power supply means floating from a ground potential.

2. An amplifier as claimed in claim 1, wherein said power supply means comprises a power transformer, rectification means for rectifying a secondary output of said power transformer, and one smoothing capacitor which is interposed between positive and negative outputs of said rectification means, an output of said smoothing capacitor being fed to said input and output means.

3. An amplifier as claimed in claim 1, wherein said power supply means comprises a power transformer, rectification means for rectifying a secondary output of said power transformer, one smoothing capacitor which is interposed between positive and negative outputs of said rectification means, and high resistance means for connecting the positive and negative outputs to a reference (ground) potential.

4. An amplifier as claimed in claim 3, wherein said high resistance means comprises first and second high resistances which are connected in series between the positive and negative outputs, a node of said two high resistances being connected to the reference potential.

5. An amplifier as claimed in claim 4, wherein said first and second resistances of said high resistance means have equal values.

6. An amplifier as claimed in claim 4, wherein said first and second resistances of said high resistance means have unequal values.

7. An amplifier as claimed in claim 4, wherein capacitors are connected in parallel with the respective first and second resistances of said high resistance means.

8. An amplifier as claimed in claim 1, wherein said input means and said output means consist of two sets of amplifier circuits, each set including a pre-amplifier and an output amplifier driven by the corresponding pre-amplifier; said pre-amplifiers are amplifiers which provide inverted and noninverted signals with respect to an input signal, respectively; and said output amplifiers are operated in phases opposite to each other, a load being connected between outputs of said output amplifiers.

9. An amplifier as claimed in claim 1, wherein said input means and said output means are of balanced type.

10. In a BTL amplifier having two sets of amplifier circuits, each set consisting of a pre-amplifier and an output circuit driven by the corresponding pre-amplifier, the respective pre-amplifiers providing noninverted and inverted signals with respect to an input voltage signal, said two sets of amplifier circuits being operated in phase opposition to each other, and a load connected between output points of the respective output circuits; the improvements comprising: said two pre-amplifiers being constructed as current output type amplifiers which provide amplified current signals proportional to the input voltage signal, said two output circuits being similarly constructed as current output type amplifiers, and a power supply for driving said two output circuits, said power supply being substantially isolated from ground potential points of said two pre-amplifiers.

* * * * *